United States Patent
Chung et al.

(10) Patent No.: US 7,281,230 B2
(45) Date of Patent: Oct. 9, 2007

(54) METHOD OF USING MIXED MULTI-VT DEVICES IN A CELL-BASED DESIGN

(75) Inventors: Shine Chien Chung, Taipei Hsien (TW); Cliff Hou, Taipei (TW); Kun-Lung Chen, Taipei (TW); Lee-Chung Lu, Taipei (TW)

(73) Assignee: Taiwan Semiconductor Manufacturing Company (TW)

( * ) Notice: Subject to any disclaimer, the term of this patent is extended or adjusted under 35 U.S.C. 154(b) by 295 days.

(21) Appl. No.: 11/111,281

(22) Filed: Apr. 20, 2005

(65) Prior Publication Data

US 2006/0238220 A1 Oct. 26, 2006

(51) Int. Cl.
*G06F 17/50* (2006.01)

(52) U.S. Cl. .................. 716/11; 716/6; 716/8

(58) Field of Classification Search .................. 716/1, 716/6, 8, 11
See application file for complete search history.

(56) References Cited

U.S. PATENT DOCUMENTS

2002/0002701 A1* 1/2002 Usami et al. .................. 716/8
2004/0075470 A1* 4/2004 Oodaira et al. ............. 326/121

* cited by examiner

*Primary Examiner*—Thuan Do
(74) *Attorney, Agent, or Firm*—Duane Morris, LLP

(57) ABSTRACT

A method is disclosed for utilizing mixed low threshold voltage (low-Vt) and high threshold voltage (high-Vt) devices in a cell-based design such that a tradeoff of both the circuit speed and power performance may be achieved. Using cells having non-uniform threshold devices for designing circuit, the speed or/and power optimization is comparable to fully custom designs.

16 Claims, 4 Drawing Sheets

METHOD OF USING MIXED MULTI-VT DEVICES IN A CELL-BASED DESIGN

BACKGROUND

The present invention relates generally to cell-based design using deep sub-micron devices. Still more particularly, the present disclosure relates to the methodology of incorporating mixed multi-Vt devices in deep sub-micron standard cells, thereby increasing overall performance and reducing power dissipation. With granularity of multi-Vt devices down to transistor level, rather than cell level, a cell-based design can approach the speed and power performance of a full custom design.

Semiconductor technology is evolving into the very deep sub-micron geometries of less than 100 nanometers (nm) to integrate more complex functionality at higher performance on a single chip. This technology is needed to produce the complex system-on-chip (SOC) designs required for today's portable devices such as cellular telephones, laptops, and other electronic devices. Since these portable devices use batteries, the chip power dissipation has become as critical a factor as circuit performance or speed.

Sub-100 nm devices offer more complex functionality and higher performance, but not without a cost. It has been observed that when the transistor channel length is small enough, current continues to flow even during standby states because of leakage. As such, power is unnecessarily dissipated in these nanometer geometry designs, thereby draining battery power. The tradeoff between chip performance and power dissipation is becoming an increasingly important issue in deep sub-micron designs.

The increased power dissipation of sub-100 nm devices is due to an effect called "sub-threshold conduction". When the gate-source voltage (Vgs) of a sub-micron gate is lower than its threshold voltage (Vt), it is in the sub-threshold region. This can be characterized by a logarithmic change in drain current with a change in Vgs until this device is completely turned off. Previous semiconductor above-100 nm devices had higher Vt such that the drain current was insignificant when Vgs=0. In sub-100 nm devices, threshold voltage Vt is so low, when Vgs=0 or during standby states, that drain current becomes significant. Other than subthreshold voltage effect, punch-through can also cause device leakage. The very thin gate oxide for very deep sub-micron devices also increases gate leakage current.

To counter this issue, manufacturers have created sub-100 nm devices with higher Vt (high-Vt devices), but these devices are slower and can affect chip speed and performance. In a typical 90 nm process, a device with lower Vt (low-Vt device) would have sub-threshold leakage current of approximately 10 nA/um, while a high-Vt device would have sub-threshold leakage current of approximately 1 nA/um. Therefore, the power dissipation may be reduced by a factor of ten if a high-Vt device is used in place of a low-Vt device. However, the circuit performance may not meet its requirements due to the lower speed of the high-Vt devices. A tradeoff of performance and power dissipation must be made to meet both speed and power constraints in sub-100 nm designs.

Circuits are conventionally designed by using circuit cells, which are basic building blocks that have all transistors contained therein with the same transistor properties. The transistors in a cell are either all high-Vt devices or all low-Vt devices, and there is no standard cell available that can accommodate devices with different threshold properties to maximize the functions of the cell.

Desirable in the art of cell design are additional methodologies that may utilize mixed low-Vt and high-Vt devices, such that a tradeoff of both the chip performance and power dissipation criteria may be performed and optimized.

SUMMARY

In view of the foregoing, this invention provides a method for utilizing mixed low-Vt and high-Vt devices in a circuit cell such that a tradeoff of both the circuit speed and power performance may be optimized.

In one example, mainly low-Vt devices are used for a speed-critical design, and in another example, mainly high-Vt devices are used in a power-critical design. The multiple Vt devices can be combined in the same standard circuit cells to ensure that speed or power optimization designs are comparable to fully custom designs.

The construction and method of operation of the invention, however, together with additional objects and advantages thereof will be best understood from the following description of specific embodiments when read in connection with the accompanying drawings.

DESCRIPTION

In the present invention, a methodology is disclosed to utilize a mixture of low-Vt and high-Vt devices in a circuit cell to design a circuit, not just using both high-Vt and low-Vt cells in the circuit, such that both chip performance and power dissipation criteria may be optimized. This methodology utilizes mainly low-Vt devices in cells for speed-critical designs. For example, through the optimization process, low-Vt cells not in the critical path are substituted by high-Vt cells to maintain the same speed while reducing power consumption. Furthermore, by granulating cells in the critical path at the device level, further power conservation is achieved. The same procedure and methodology can be applied to power-critical designs starting with high-Vt cells. Further, this multi-Vt methodology intends to utilize standard processes and design tools that are readily available.

Figure 1A:
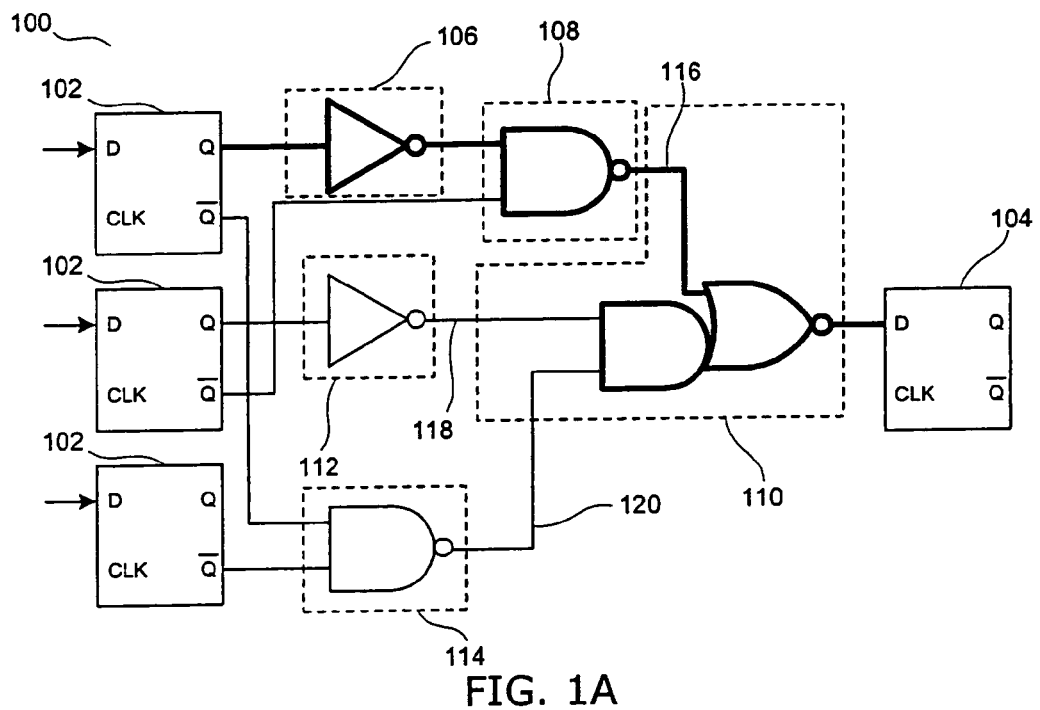
FIG. 1A illustrates a typical circuit in which the multi-Vt methodology may be applied.

FIG. 1A illustrates a typical circuit 100 in which the multi-Vt methodology may be applied. The clock rating of the circuit 100 is imparted by the propagation delay between D flip-flops 102 and another D flip-flop 104. Since there are various signal paths, the clock rating is determined by the longest signal path, or the critical path(CP). In the circuit 100, there are three such signal paths to consider. The first path is made up by cells 106, 108, and 110. The second path is made up by cells 112 and 110, while the third path is made up by cells 114 and 110. It is noted that the cell 110 has three input lines: lines 116, 118 and 120, each of which represents a part of the three paths. Further it is understood that the cell 110 is an "AND-OR-Inverted" (AOI) cell.

If all three paths utilize the same cell types with the same propagation delay per cell, it is obvious that the first path, as illustrated in bold, would have the largest propagation delay and therefore would be the critical path. In conventional designs, all cells within the critical path would be low-Vt standard cells, thereby ensuring adequate speed. These low-Vt standard cells are completely constructed with low-Vt devices. Similarly, all cells within non-critical paths would be high-Vt standard cells, thereby reducing power dissipation. These high-Vt standard cells are completely constructed with high-Vt devices. However, conventional designs do not allow some of the low-Vt devices in low-Vt cells to be replaced with high-Vt devices without affecting overall speed. This inflexibility in conventional designs prohibits added optimization that may be realized in more robust designs.

Figure 1B:
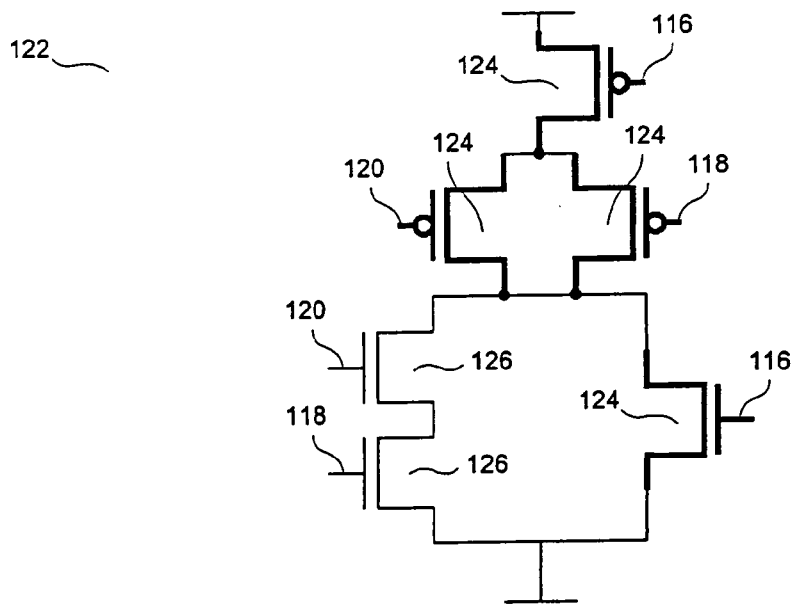
FIG. 1B shows a transistor diagram of a typical cell in FIG. 1A such that mixed Vt-devices can be built in the same circuit cell.

FIG. 1B shows a transistor diagram 122 of the cell 110 of in FIG. 1A. The cell 110 has three input lines: lines 116, 118 and 120. The diagram 122 shows the implementation of multi-Vt devices to design the device 110 by using a mixture of low-Vt and high-Vt devices in the same cell. In conventional designs, the cells are made of devices of the same Vt, whether the cells are in the critical or non-critical path. For example, the cell 110 is obtained from the low-Vt cell library, wherein all cells are completely constructed with low-Vt devices 124. In accordance with one embodiment of this invention, even within a cell, it is also determined whether a combination of devices with different threshold voltages can be used and still deliver the expected function of the cell. In essence, it is determined whether a critical path also exists in a single cell, and the devices on the critical path have to be the low-Vt devices for speed concerns, while all other devices in the cell are on the non-critical paths, and therefore they may be replaced by high-Vt devices without affecting the speed performance. In this figure, the devices used in the critical path remain low-Vt devices, as illustrated in bold. In this manner, a new cell is now designed to include both high-Vt and low-Vt devices. In this embodiment, by granulating in the transistor level, additional power savings may be attained by using high Vt devices.

Figure 2:
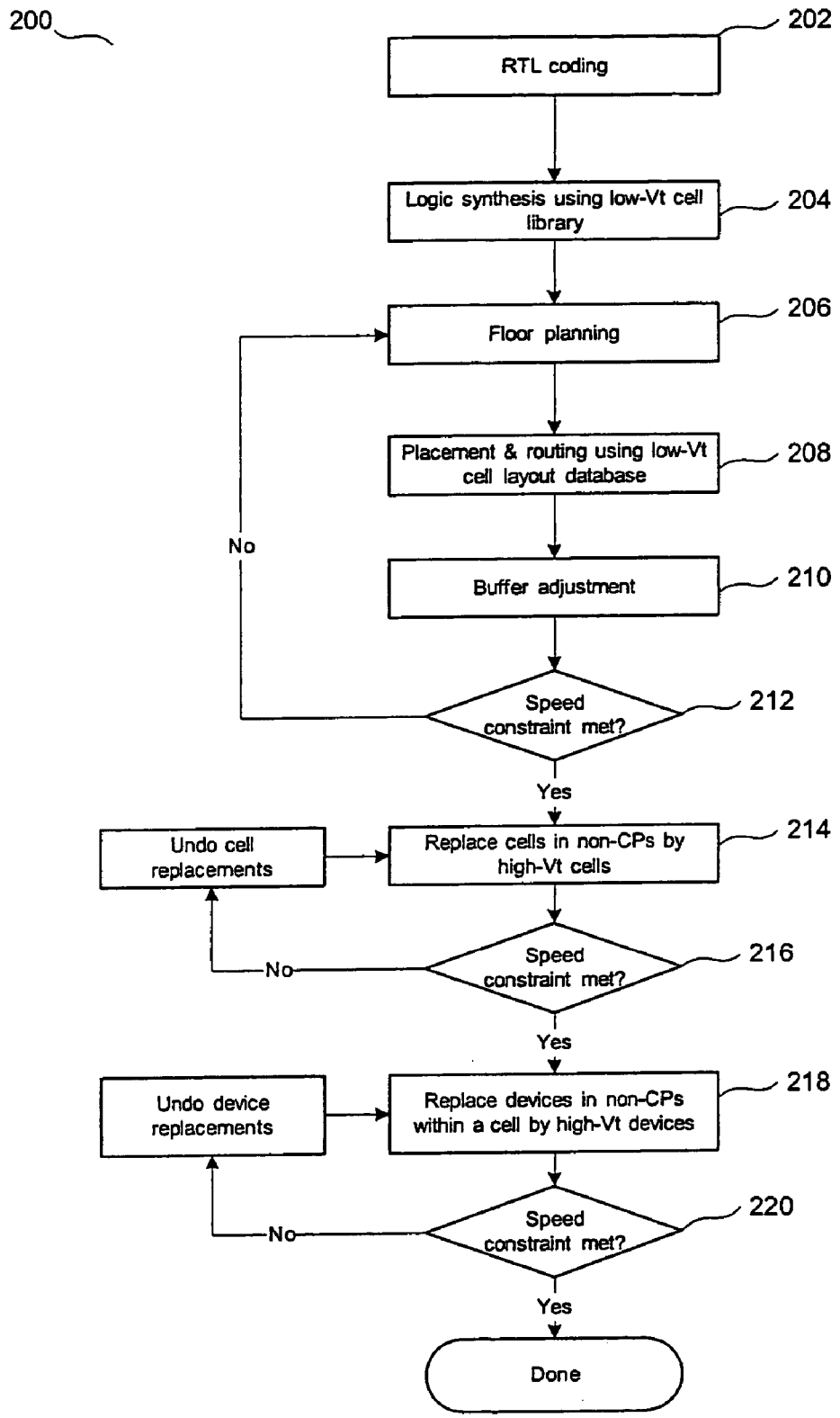
FIG. 2 presents a speed-critical design process in accordance with one embodiment of the present invention.

FIG. 2 presents a process 200 for providing a speed-critical circuit design in accordance with one embodiment of the present invention. Starting at step 202, Register-Transfer Level (RTL) coding is generated from a high level description of the desired design. In step 204, synthesis tools, which include a variety of complex calculations, are used to generate a logical gate level circuit based upon the high level description of the design. Since traditional synthesis tools only allow one type of device types in a library, these tools must be modified to allow a mixture of high-Vt and low-Vt devices to co-exist in a multi-Vt implementation. The new synthesis tool first selects from either a low-Vt or high-Vt cell library. In this design example, since speed is the critical factor, the low-Vt cell library is first used. In step 206, floor planning yields a preliminary physical layout. This step is then followed by step 208, where each device and each route is placed with the necessary signal inter-connections. The low-Vt layout database is used for the physical placement, and the signal routing is reviewed and changed as needed to meet the speed constraint. Buffers are adjusted in step 210 and the standard cell speed is analyzed to determine if the speed constraint has been met at step 212. It is understood that the adjustment of buffers includes buffer insertion, deletion and timing optimization management. If not, then an additional round of placement and routing is performed. If the speed constraint is met in step 212, then the low-Vt cells are replaced with high-Vt cells in step 214 in one or more selected (or all) non-critical paths to minimize the power dissipation/consumption. The replacement is carried on sequentially with a priority from the least critical to the most critical paths with a checking of the speed constraint after the replacement. It is understood that the most critical path is the slowest path while the least critical path is the fastest one. Therefore, in step 216 while checking the speed constraint for each path, if the speed constraint is not met, the cell replacements for the path are undone and the process continues on with other paths. If the speed constraint is fully met, then devices in one or more selected non-critical paths within a cell are replaced by high-Vt devices. This process can be carried out from one non-critical path to another. These replaced devices may still be those that are not associated with the actual critical path and the replacement does not disturb the speed performance to fail the speed constraint. As shown, for example, in step 220, it is determined whether the cell has met the critical speed constraint. If not, the design process returns to step 218, the replacements are undone and the process moves on to other paths. By replacing the low-Vt cells with high-Vt cells and then partially replacing low-Vt devices by high-Vt devices in selected cells one by one after the initial timing optimization is done, the speed requirements can be reached while the power consumption can be reduced. As it is illustrated above, if any replacement process causes the failure to meet the speed requirement, the replacements may be reversed rather than redoing the timing optimization and buffer insertion for adjusting the speed.

Figure 3:
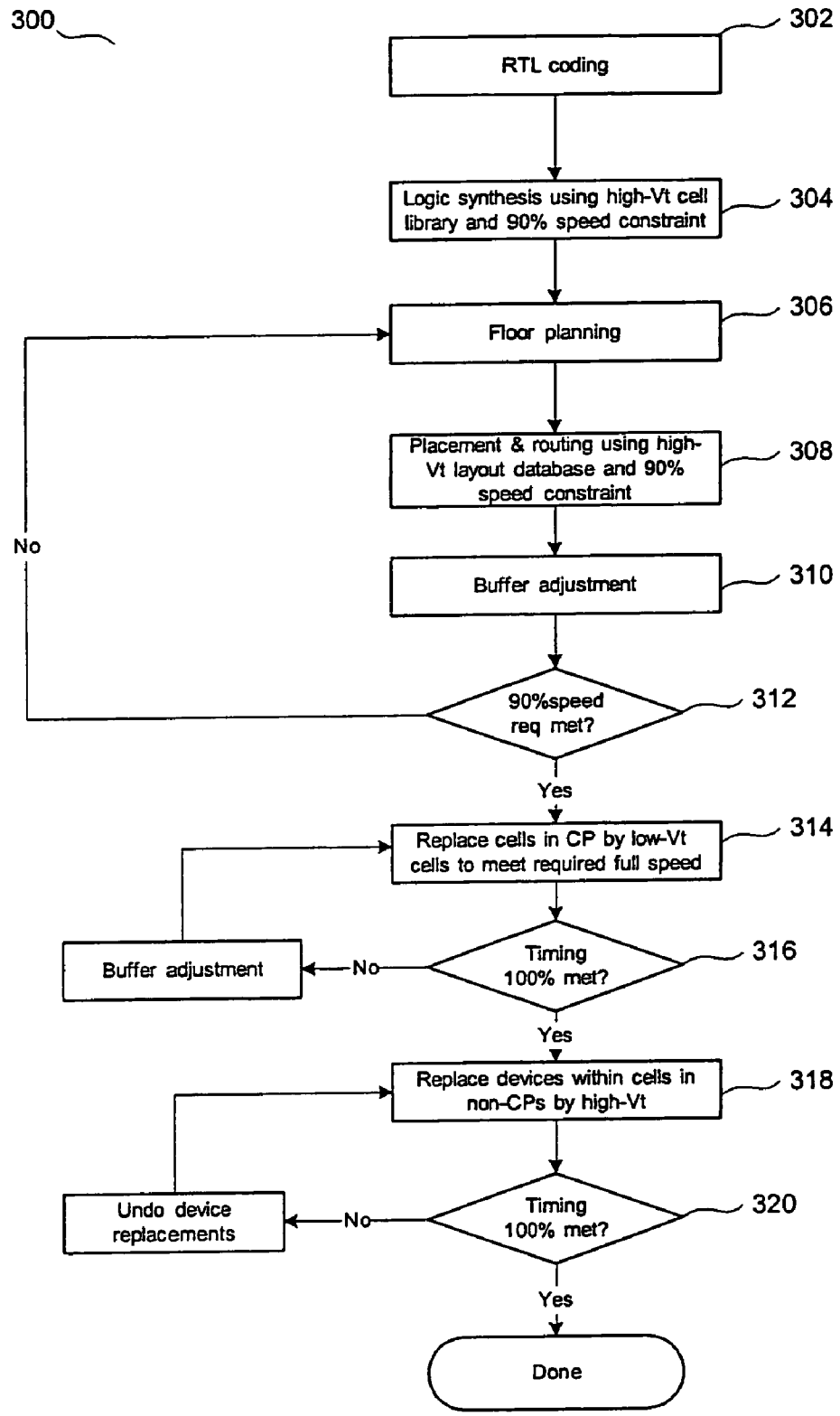
FIG. 3 presents a power-critical design process in accordance with one embodiment of the present invention.

FIG. 3 presents a power-critical cell design process 300 in accordance with one embodiment of the present invention. Starting at step 302, RTL coding is generated from a high level description of the desired design. In step 304, RTL synthesis tools are used to generate a logical gate level cell circuit based upon the high level description of the design. The new synthesis tool selects from either a low-Vt or high-Vt cell library. In this design example, since power dissipation/consumption is the critical factor, the high-Vt cell library is first selected. In step 304, the logic synthesis must also satisfy a predetermined percentage such as at least 80% or 90% of the speed constraint. In step 306, floor planning yields a preliminary physical layout. This step is then followed by step 308, where each cell and each route is placed with the necessary signal inter-connections. Each cell is reviewed and changed as needed to meet at least a portion of the speed constraint. For example, the speed constraint may be the predetermined percentage (e.g., 90%) of the desired clock rate. This speed constraint provides a base for improving the speed performance with the introduction of minimum number of low-Vt cells in critical path while the majority of cells are high-Vt cells, a process which will be further discussed below. Depending on design experience, placement and routing may achieve a high percentage of the speed constraint without excessively utilizing low-Vt cells. Buffers are adjusted in step 310, before the speed is analyzed to determine if the predetermined percentage (e.g., 90%) of the speed constraint has been met at step 312. If speed constraint has not been met, then an additional round of placement and routing is performed. At this point, all cells are made of high Vt devices so far, and using a percentage of speed constraint as a benchmark for executing timing optimization can prevent introducing excessive low-Vt cells. Then the high-Vt cells are replaced with low-Vt cells in step 314 in the critical path to meet not just 90%, but 100% of the speed constraint. In step 316, if 100% of the speed constraint is not met, buffers have to be adjusted or floor is re-planned 306. Once 100% speed constraint is met, devices within selected one or more cells in non-critical paths are replaced by high-Vt devices in step 318. The timing is checked once again at step 320. It is understood that these replaced devices are those that are not associated with the actual critical path. If the speed constraint is not fully met, the replacements are reversed and fewer high-Vt devices are used instead. Finally, if it is determined that all the paths have been checked and the speed constraint is fully met in step 320, the design process is completed. It is understood that the process of replacing high-Vt cells in the non-critical paths performed in steps 318 and 320 can be done through multiple rounds of replacement with the number of the high-Vt cells set in a decreasing fashion. In some cases, iterations to floor planning 306 or buffer adjustment 310 are also necessary.

Figure 4:
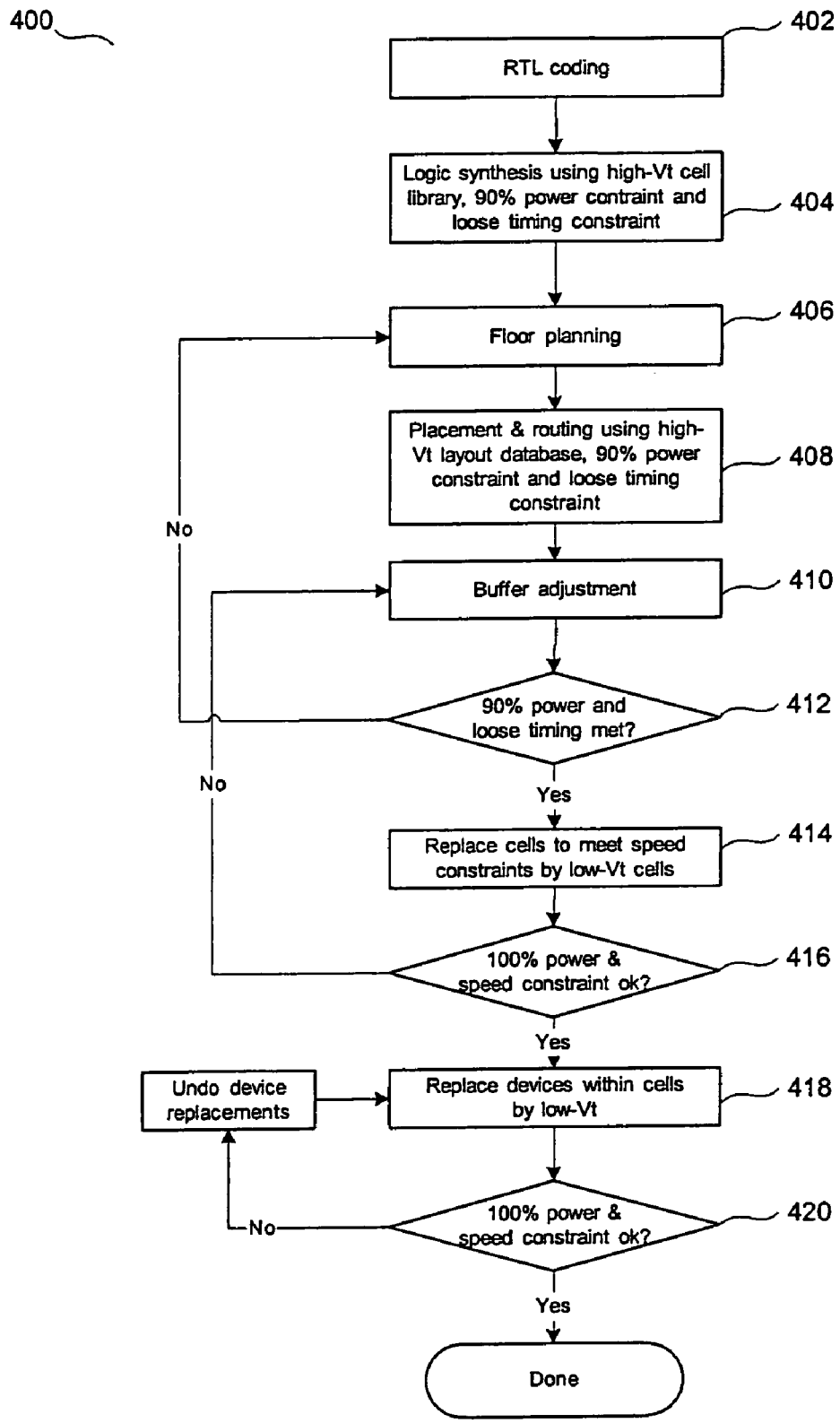
FIG. 4 presents a minimum-power design process in accordance with one embodiment of the present invention.

FIG. 4 presents a minimum-power cell circuit design process 400 in accordance with one example of the present disclosure. In step 402, RTL coding is generated from a high level description of the desired design. In step 404, RTL synthesis tools are used to generate a logical gate level circuit based upon the high level description of the design. In step 404, a predetermined percentage (e.g., 90%) of the power constraint and a loose timing constraint are satisfied. In this design example, since power dissipation/consumption is the critical factor, the high-Vt cell library is first selected. In step 406, floor planning yields a preliminary physical layout. This step is then followed by step 408, where each device and each route is placed with necessary signal inter-connections. The cell library layout database is used for the physical placement and signal routing. The design is reviewed and changed as needed to meet 90% of the power constraint. Buffers are adjusted in step 410 and the standard cell speed is analyzed to determine if the predetermined percentage (e.g., 90%) of the power constraint has been met in step 412. If not, then an additional round of placement and routing is performed.

If the predetermined percentage (e.g., 90%) of the power constraint is met in step 412, then the next step is to replace a certain number of cells in predetermined paths by low-Vt cells for further optimization to meet the full speed requirements in step 414. For example, cells in the circuit paths met only 90% of the speed requirements are undergoing a replacement process. In step 416, if either the speed constraint or the power dissipation constraint is not met, another round of buffer adjustment or floor re-planned is performed according to the need of adjustment.

If both constraints are met, devices within low-Vt cells not in the critical path are replaced with high-Vt devices in step 418. In step 420, it is further determined whether both speed and power constraints are still met in this minimum-power design. If not, the replacements are reversed and moved on to other paths until all paths are checked. In some cases, iterations to floor planning 406 or to buffer insertion 410 are necessary.

The above illustration provides many different embodiments or embodiments for implementing different features of the invention. Specific embodiments of components and processes are described to help clarify the invention. These are, of course, merely embodiments and are not intended to limit the invention from that described in the claims. For example, although various devices can be used, devices in the cells are preferred to have a gate width less than 100 nm.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for using multiple threshold voltage cells in a speed critical circuit, the method comprising:
   forming a preliminary physical layout of the circuit using one or more low threshold voltage (low-Vt) cells;
   replacing at least a portion of the low-Vt cells in one or more non-critical paths of the circuit by one or more high threshold voltage (high-Vt) cells without failing to meet the speed constraint; and
   replacing one or more devices in a critical path within at least one low-Vt cell, which is in the critical path of the circuit, by high-Vt devices without failing to meet the speed constraint;
   wherein the low-Vt cells are replaced by the high-Vt cells sequentially with a priority starting from the least critical to the most critical paths of the circuit.

2. The method of claim 1 further comprising floor planning for the predetermined circuit.

3. The method of claim 1 further comprising examining and adjusting one or more buffers.

4. The method of claim 1 wherein the low-Vt and high-Vt devices in cells have gate widths less than 100 nm.

5. The method of claim 1 wherein all the low-Vt cells in the non-critical path of the circuit are replaced by the high-Vt cells.

6. A method for using multiple threshold voltage cells in a power critical circuit, the method comprising:
   forming a preliminary physical layout of the circuit using one or more high threshold voltage (high-Vt) cells meeting a predetermined percentage of a speed constraint;
   replacing at least a portion of the high-Vt cells in a critical path of the circuit by one or more low threshold voltage (low-Vt) cells without failing to meet the speed constraint; and
   replacing one or more devices in a non-critical path within at least one low-Vt cell, which is in the critical path of the circuit, by high-Vt devices without failing to meet the speed constraint;
   wherein the predetermined percentage is at least 80 percent.

7. The method of claim 6 wherein the forming further includes floor planning for the predetermined circuit.

8. The method of claim 6 further comprising examining and adjusting one or more buffers after replacing the high-Vt cells with low-Vt cells.

9. The method of claim 8 wherein the high-Vt cells are replaced in multiple rounds by the low-Vt cells.

10. The method of claim 6 wherein the low-Vt and high-Vt devices in cells have gate widths less than 100 nm.

11. A method for using multiple threshold voltage cells in a power critical circuit, the method comprising:
   forming a preliminary physical layout of the circuit using one or more high threshold voltage (high-Vt) cells meeting a predetermined percentage of a power constraint;
   replacing at least a portion of the high-Vt cells in a critical path of the circuit by one or more low threshold voltage (low-Vt) cells without failing to meet a speed constraint; and replacing one or more devices in the non-critical path within a predetermined portion of the low-Vt cells, which is in the critical path of the circuit, by high-Vt devices without failing to meet both the power and the speed constraints;

wherein the predetermined percentage is at least 80 percent.

12. The method of claim 11 wherein the forming further includes floor planning for the predetermined circuit.

13. The method of claim 11 further comprising examining and adjusting one or more buffers after replacing the high-Vt cells with low-Vt cells.

14. The method of claim 13 wherein the high-Vt cells are replaced in multiple rounds by the low-Vt cells.

15. The method of claim 11 wherein the low-Vt and high-Vt devices in cells have gate widths less than 100nm.

16. A method for using multiple threshold voltage cells in a power critical circuit, the method comprising:

forming a preliminary physical layout of the circuit using one or more high threshold voltage (high-Vt) cells meeting a predetermined percentage of a power constraint;

replacing at least a portion of the high-Vt cells in a critical path of the circuit by one or more low threshold voltage (low-Vt) cells without failing to meet a speed constraint; and replacing one or more devices in the non-critical path within a predetermined portion of the low-Vt cells, which is in the critical path of the circuit, by high-Vt devices without failing to meet both the power and the speed constraints; and examining and adjusting one or more buffers after replacing the high-Vt cells with low-Vt cells;

wherein the high-Vt cells are replaced in multiple rounds by the low-Vt cells; and wherein the predetermined portion of the low-Vt cells is no less than 5 percent.

* * * * *